(12) United States Patent
Orikasa et al.

(10) Patent No.: US 10,128,210 B2
(45) Date of Patent: Nov. 13, 2018

(54) METHOD FOR PRODUCING SEMICONDUCTOR PACKAGE

(71) Applicant: TDK CORPORATION, Tokyo (JP)

(72) Inventors: Makoto Orikasa, Tokyo (JP); Hideyuki Seike, Tokyo (JP); Yuhei Horikawa, Tokyo (JP); Hisayuki Abe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 19 days.

(21) Appl. No.: 15/449,361

(22) Filed: Mar. 3, 2017

(65) Prior Publication Data

US 2018/0254255 A1    Sep. 6, 2018

(51) Int. Cl.
| | | |
|---|---|---|
| *H01L 21/00* | (2006.01) | |
| *H01L 23/00* | (2006.01) | |
| *H01L 25/00* | (2006.01) | |
| *H01L 25/065* | (2006.01) | |

(52) U.S. Cl.
CPC .............. *H01L 24/81* (2013.01); *H01L 24/95* (2013.01); *H01L 25/0657* (2013.01); *H01L 25/50* (2013.01); *H01L 2224/81002* (2013.01); *H01L 2224/81014* (2013.01); *H01L 2224/81022* (2013.01); *H01L 2224/81035* (2013.01); *H01L 2224/81047* (2013.01); *H01L 2224/81048* (2013.01); *H01L 2224/81065* (2013.01); *H01L 2224/81143* (2013.01); *H01L 2224/81815* (2013.01); *H01L 2224/95146* (2013.01); *H01L 2225/06513* (2013.01); *H01L 2225/06541* (2013.01); *H01L 2225/06565* (2013.01)

(58) Field of Classification Search
CPC ......... H01L 24/13; H01L 24/16; H01L 24/75; H01L 24/81; H01L 24/95; H01L 25/0657; H01L 25/50
USPC ................................ 438/108, 109, 612, 613
See application file for complete search history.

(56) References Cited

U.S. PATENT DOCUMENTS

| | | | |
|---|---|---|---|
| 8,757,474 B2 | 6/2014 | Abe et al. | |
| 9,119,336 B2 | 8/2015 | Abe et al. | |
| 9,136,159 B2 | 9/2015 | Kelly et al. | |
| 2005/0156324 A1 | 7/2005 | Nakase et al. | |
| 2011/0076801 A1* | 3/2011 | Aoki ....................... H01L 24/81 438/108 |
| 2013/0270329 A1* | 10/2013 | Schulte ................... H01L 24/11 228/180.22 |

FOREIGN PATENT DOCUMENTS

| | | | |
|---|---|---|---|
| JP | 2005-205418 A | 8/2005 | |
| JP | 2005-271059 A | 10/2005 | |
| JP | 5031677 B2 | 9/2012 | |
| JP | 5807221 B2 | 11/2015 | |

* cited by examiner

*Primary Examiner* — Brook Kebede
(74) *Attorney, Agent, or Firm* — Oliff PLC

(57) ABSTRACT

A method for producing a semiconductor package is a method for producing a semiconductor package in which a plurality of semiconductor chips, each of which includes a substrate, conductive portions formed on the substrate, and microbumps formed on the conductive portions, are laminated, which includes a heating process of causing a reducing gas to flow in an inert atmosphere into a space where the semiconductor chips are arranged and heated at or higher than a temperature of a melting point of the microbump, and in the heating process, a pressure application member is mounted on the microbump.

19 Claims, 10 Drawing Sheets

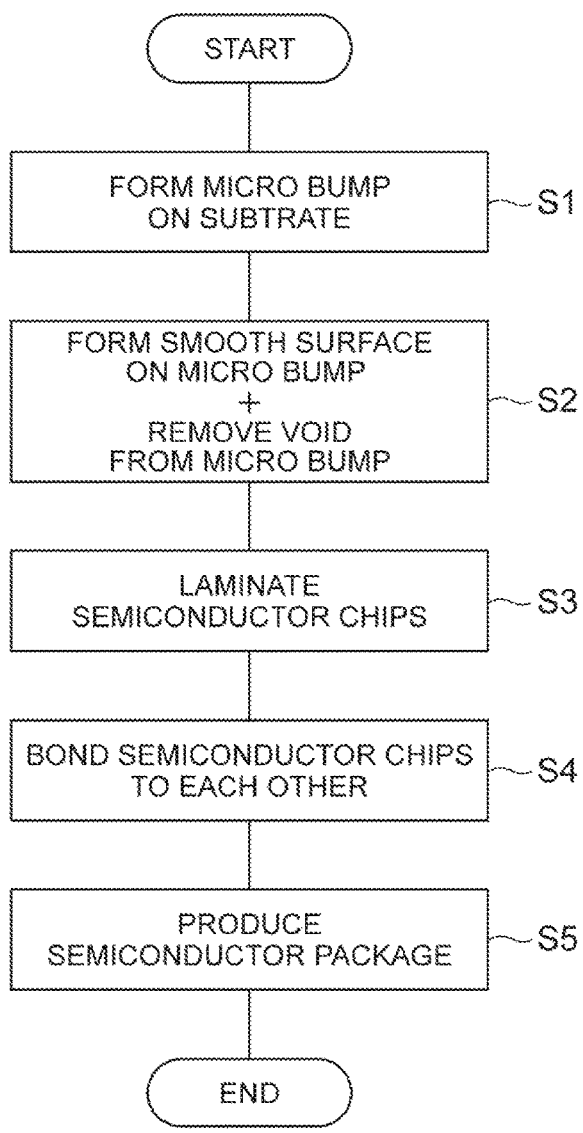

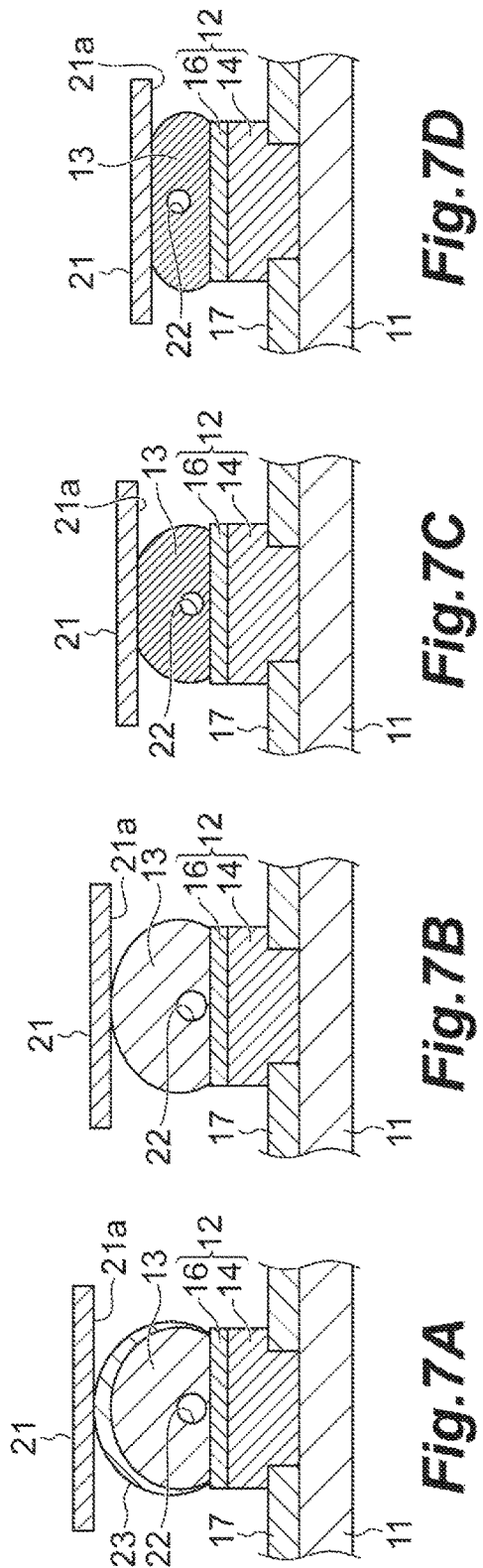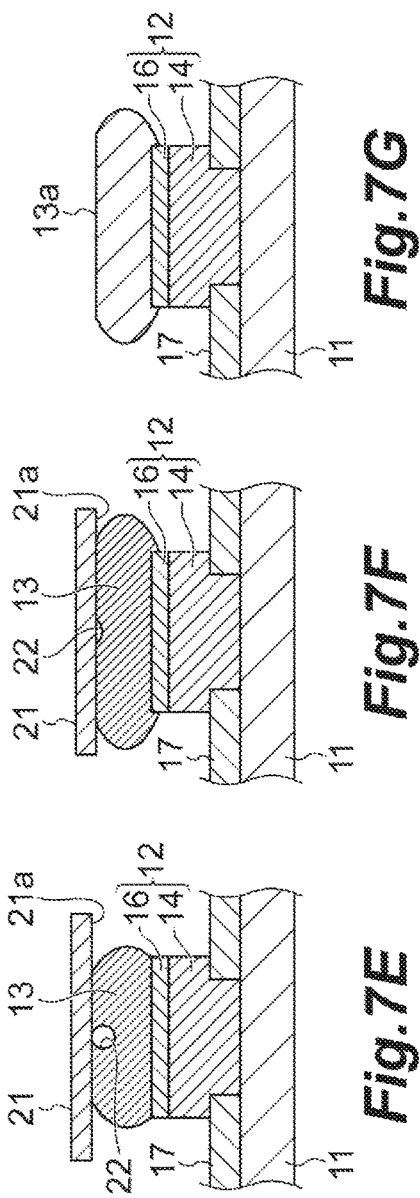

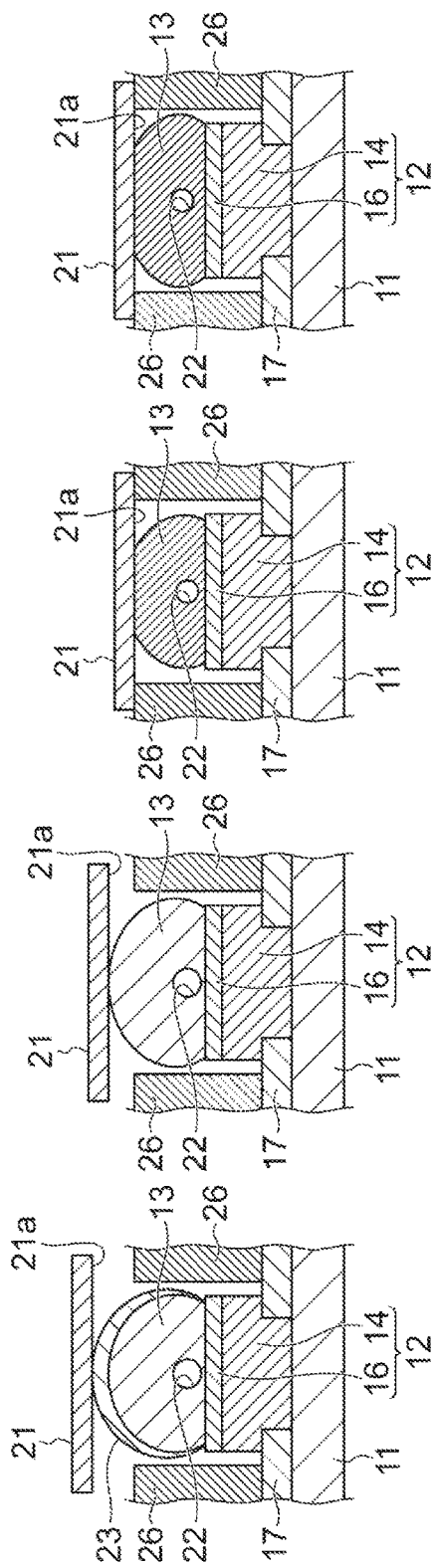

Fig. 10

| | (μg/μm²) | MICRO BUMP HEIGHT(μm²) | ATMOSPHERE | PRESENCE/ABSENCE OF SPACER | VOID | ELECTRODE FALLING OVER |
|---|---|---|---|---|---|---|
| EXAMPLE 1 | 0.0005 | 13 | N₂+FORMIC ACID | ABSENT | ○ | ○ |
| EXAMPLE 2 | 0.002 | 12 | N₂+FORMIC ACID | ABSENT | ○ | ○ |
| EXAMPLE 3 | 0.003 | 10 | N₂+FORMIC ACID | ABSENT | ○ | ○ |
| EXAMPLE 4 | 0.01 | 8 | N₂+FORMIC ACID | ABSENT | ○ | ○ |
| EXAMPLE 5 | 0.03 | 7 | N₂+FORMIC ACID | ABSENT | ○ | ○ |
| EXAMPLE 6 | 0.06 | 6 | N₂+FORMIC ACID | ABSENT | ○ | △ |
| EXAMPLE 7 | 0.06 | 10 | N₂+FORMIC ACID | PRESENT | ○ | ○ |
| COMPARATIVE EXAMPLE 1 | 0.001 | 14.5 | ATMOSPHERE | ABSENT | × | ○ |
| COMPARATIVE EXAMPLE 2 | 0.002 | 14 | ATMOSPHERE | ABSENT | × | ○ |
| COMPARATIVE EXAMPLE 3 | 0.003 | 13 | ATMOSPHERE | ABSENT | × | ○ |
| COMPARATIVE EXAMPLE 4 | 0.010 | 12 | ATMOSPHERE | ABSENT | × | ○ |
| COMPARATIVE EXAMPLE 5 | 0.03 | 11 | ATMOSPHERE | ABSENT | × | ○ |
| COMPARATIVE EXAMPLE 6 | 0.06 | 10 | ATMOSPHERE | ABSENT | × | ○ |
| COMPARATIVE EXAMPLE 7 | 0.10 | 8 | ATMOSPHERE | ABSENT | × | × |

METHOD FOR PRODUCING SEMICONDUCTOR PACKAGE

TECHNICAL FIELD

The present invention relates to a method for producing a semiconductor package.

BACKGROUND

Conventionally, in a three-dimensional installation of semiconductor package, coupling between a semiconductor chip and a semiconductor chip or an interposer is performed by wire bonding. In place of the wire bonding, a three-dimensional installation technique, with which semiconductor chips are coupled with each other via a pass-through electrode and a bump, has been developed. The pass-through electrode normally has a short connecting wire length (for example, 50 μm), and a bump, via which electrodes are connected, is also required to be microscopic. A technique that handles such a bump pitch of less than 50 μm is referred to as a microbump. As U.S. Pat. No. 9,136,159, a wiring length between semiconductor chips can be dramatically shortened by coupling the semiconductor chip and the semiconductor chip with the pass-through electrode and the microbump. Accordingly, a wiring delay time that increases with miniaturization can be reduced.

Forming processes of the microbump include a solder printing method, a solder ball mounting, and a plating method, where void generated by gas, etc. generated in a reaction process of an organic substance, water, etc. becomes an issue. In this context, Japanese Patent No. 5807221 states performing reflow in an inert atmosphere and reflow in a reducing atmosphere of hydrogen, carboxylic acid, etc.

SUMMARY

A smaller bump such as a microbump may result in bad connection and an increase in wiring resistance even with a micro void (for instance, 10 μm or less). However, a smaller void has a smaller buoyancy that is hard to be released, and particularly, an alloy layer is formed by heat on an interface between a barrier metal layer and a bump. Accordingly, it is difficult to release a void in a vicinity of alloy layer with low fluidity.

The present invention is intended to provide a method for producing a semiconductor package in which a void in a microbump can be removed with ease.

A method for producing a semiconductor package according to an aspect of the present invention is a method for producing a semiconductor package in which a plurality of semiconductor chips, each of which includes a substrate, a conductive portion formed on the substrate, and a microbump formed on the conductive portion, are laminated, which includes a heating process of causing a reducing gas to flow in an inert atmosphere into a space where the semiconductor chips are arranged and heated at or higher than a temperature of a melting point of the microbump, and in the heating process, a pressure application member is mounted on the microbump.

In this method for producing a semiconductor package, in the heating process, the reducing gas is caused to flow in the inert atmosphere into a space where the semiconductor chips are arranged. Thus, an oxide film formed on a surface of the microbump is reduced and removed. In addition, in the heating process, heated at or higher than a temperature of the melting point of the microbump, and thus the microbump is molten and gets fluidity. Here, in the heating process, a pressure application member is mounted on the microbump. Accordingly, as the microbump is molten and gets fluidity, pressure of the pressure application member causes the microbump to be deformed as if it is collapsed. The deformation generates a flow in the microbump and the void flows in the microbump. Thus, the void flowing in the microbump escapes from the microbump to outside and the void is removed. With above, the void in the microbump can be removed with ease.

As the reducing gas, carboxylic acid may be applied. Thus, an oxide film on the surface of the microbump is removed successfully.

The weight of the pressure application member may be from 0.0005 μg/μm² to 0.1 μg/μm² per cross-sectional area of the microbump. Thus, the pressure application member is capable of applying an appropriate pressure to remove the void on the microbump.

A spacer that has a certain thickness is arranged on the substrate and the pressure application member may be pushed to contact the spacer. This causes the spacer to stop the pressure application member and thus can prevent the microbump from being collapsed too much.

According to the present invention, a method for producing a semiconductor package in which a void in a microbump can be removed with ease can be provided.

BRIEF DESCRIPTION OF THE DRAWINGS

FIG. 2 is a flow chart that presents a procedure of a method for producing a semiconductor package;

FIGS. 7A to 7G are schematic sectional views that present the procedure of the smooth surface formation process (void removal process);

FIGS. 8A to 8G are schematic sectional views that present the procedure of the smooth surface formation process (void removal process) according to a variation;

FIG. 10 is a table that presents experiment results of Examples and Comparative Examples.

DETAILED DESCRIPTION

Figure 1:
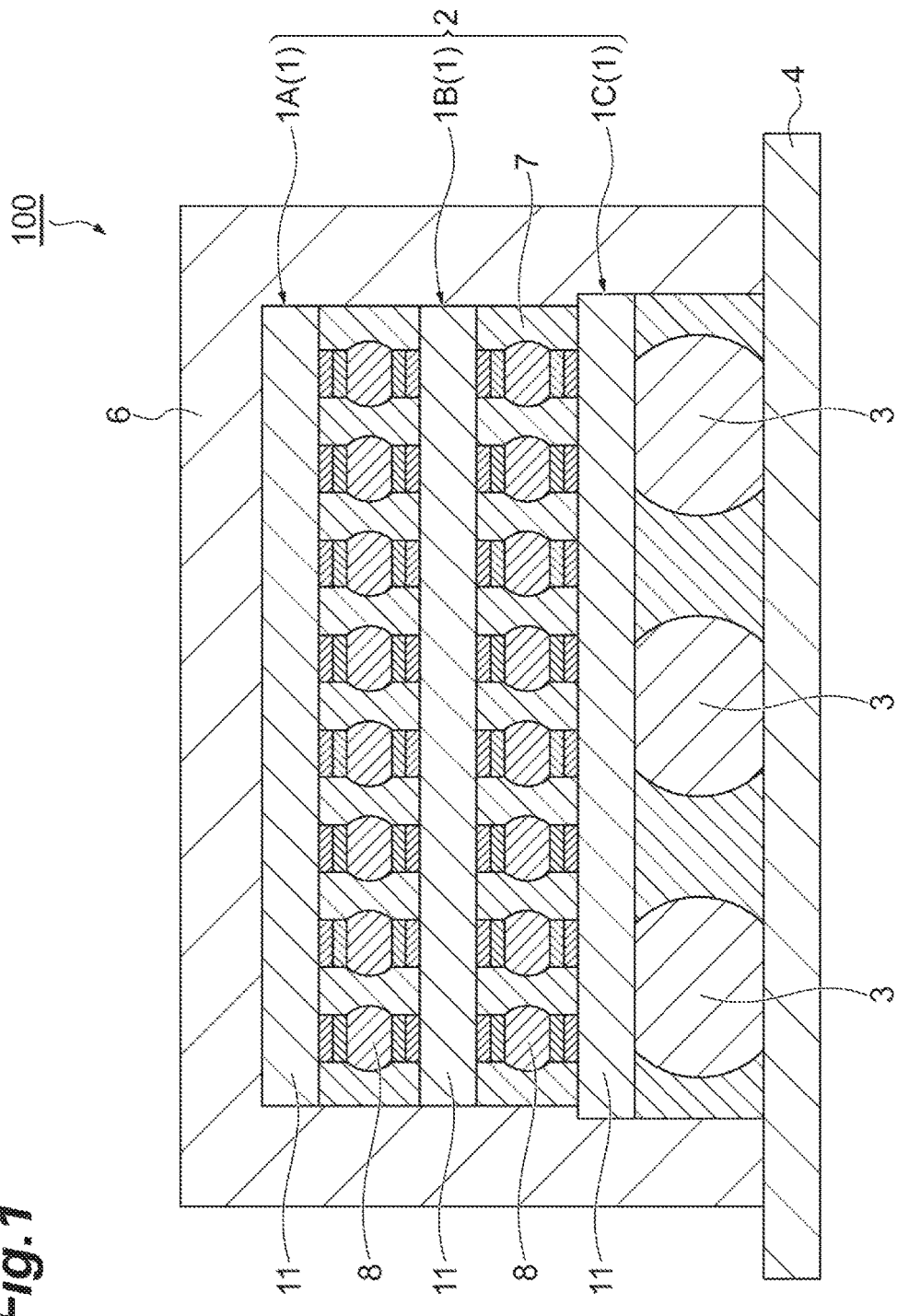
FIG. 1 is a schematic sectional view that presents an embodiment of a semiconductor package.

Now, preferred embodiments of a method for producing a semiconductor package according to an aspect of the present invention will be described in detail with reference to the drawings. It should be noted that elements that are identical or elements that have an identical function are designated by the same reference numerals, and redundant descriptions will be curtailed.

FIG. 1 is a schematic sectional view that presents an embodiment of a semiconductor package. As presented in FIG. 1, a semiconductor package 100 includes a laminate 2 constituted by laminating three or more (it is three here) semiconductor chips 1, an organic substrate 4 electrically connected with the laminate 2 via a solder ball 3, and a molded portion 6 formed by covering with a mold resin the laminate 2 mounted on the organic substrate 4. It should be noted that an inner space of the molded portion 6 is filled with an underfill 7 so that gaps between the semiconductor chips 1 of the laminate 2 are filled. In the present embodiment, the laminate 2 is constituted by laminating the semiconductor chip 1A, the semiconductor chip 1B, and the semiconductor chip 1C in a vertical direction. The semiconductor chip 1A and the semiconductor chip 1B are bonded via a bonded portion 8 bonded by melting the microbump. The semiconductor chip 1C and the semiconductor chip 1B are bonded via the bonded portion 8 bonded by melting the microbump.

Figure 4A:
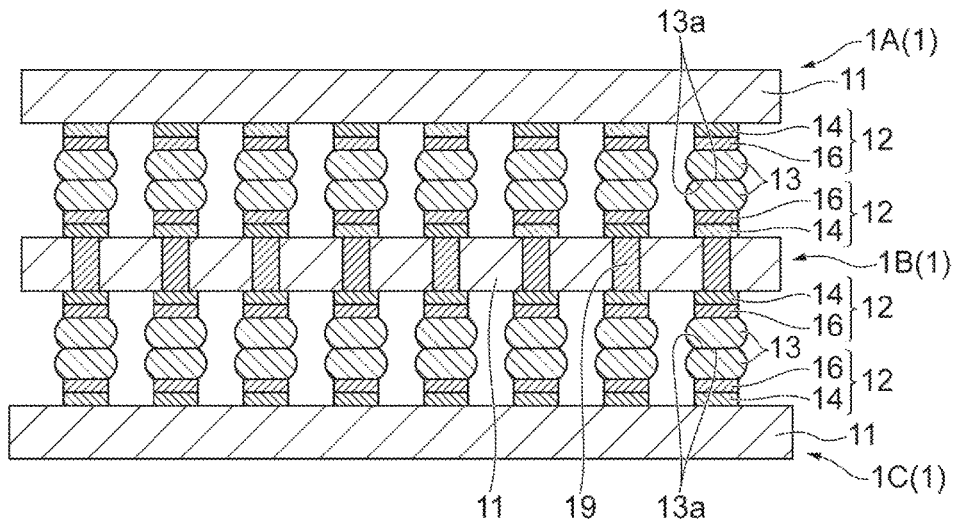
FIG. 4A is a schematic sectional view that presents semiconductor chips being laminated.
Figure 4B:
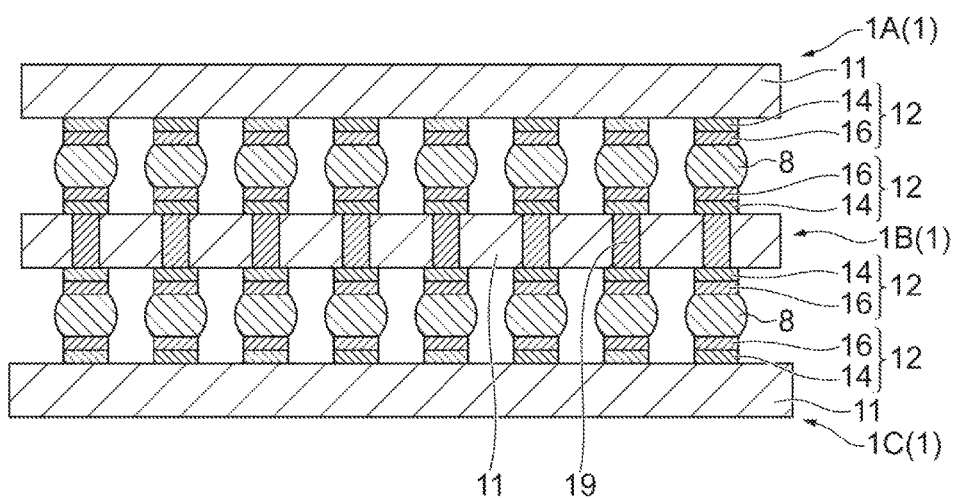
FIG. 4B is a schematic sectional view that presents semiconductor chips being coupled with each other.

For example, as presented in FIG. 4A, the semiconductor chips 1 before bonded include a substrate 11, conductive portions 12 formed on the substrate 11, and microbumps 13 formed on the conductive portions 12. The substrate 11 is composed of, for instance, a semiconductor chip such as a silicon (Si) chip, a silicon (Si) interposer, and the like. It should be noted that the semiconductor chip 1A and the semiconductor chip 1C are provided with the conductive portions 12 formed only on one principal surface. The semiconductor chip 1B is provided with the conductive portions 12 formed on both principal surfaces. In addition, the conductive portions 12 formed on both principal surfaces of the semiconductor chip 1B are connected to each other via through hole electrodes 19 that extend in a thickness direction of the substrate 11.

The plurality of conductive portions 12 are formed on the principal surfaces of the substrate 11. The conductive portions 12 are arranged with a predetermined pitch on the principal surfaces of the substrate 11. The conductive portion 12 includes an electrode pad 14 formed on the principal surface of the substrate 11 and a barrier metal layer 16 formed on an upper surface of the electrode pad 14. It should be noted that a portion of the principal surface of the substrate 11 on which the conductive portions 12 are not formed is covered with an insulation layer 17 (see FIG. 5). As materials that compose the barrier metal layer 16, for example, Ni, Ni compound (such as NiP), and the like are used. As materials that compose the insulation layer 17, for instance, SiO, SiN, polyimide and the like are used.

The microbump 13 is formed on the barrier metal layer 16 of the conductive portion 12. The microbump 13 may include Sn, Ag, Cu, Ag—Cu, Bi, In, and the like as materials that compose the microbump 13, and an alloy of any two or more of these materials may be used. In particular, the microbump 13 may include Sn as a principal component. The microbump 13 may be formed by plating for example. Alternatively, the microbump 13 may be formed by using a micro ball made of a solder alloy, and it may be formed by printing a paste. It should be noted that a bump that is less than 50 μm in diameter seen from above is referred to as a microbump.

Figure 5:
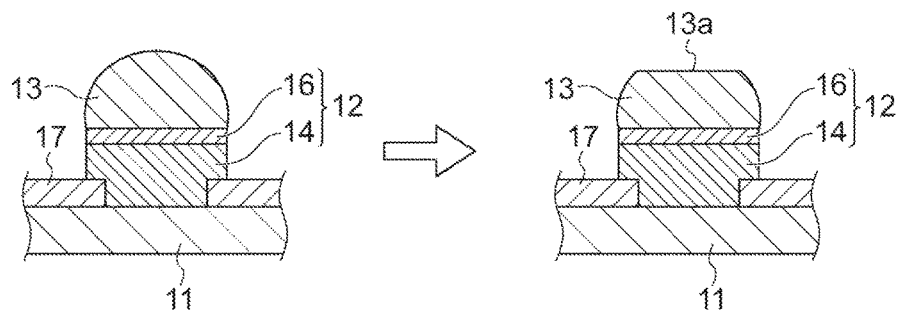
FIG. 5 is a schematic sectional view that presents a microbump before a smooth surface formation process is carried out and the microbump after a smooth surface formation process is carried out.

As presented in FIG. 5, the microbump 13 has a spherical surface immediately after being formed on the substrate 11. By providing a predetermined processing to the microbump 13, a smooth surface 13a is formed on the microbump 13. The smooth surface 13a is constituted with a flat surface extending in a horizontal direction at a top of the microbump 13. It should be noted that an example of the processing detail for forming the smooth surface 13a will be described later. A height of the microbump 13, in other words, a dimension between the smooth surface 13a and the upper surface of the conductive portion 12 can be set in a range of 5 to 50 μm.

Next, a method for producing the semiconductor package 100 according to the present embodiment will be described with reference to FIGS. 2 to 9.

As presented in FIG. 2, first, a semiconductor chip preparation process (step S1), in which the semiconductor chip 1 is prepared by forming the microbump 13 on the substrate 11, is carried out. This prepares the semiconductor chip 1A, the semiconductor chip 1B, and the semiconductor chip 1C. However, in this stage, the smooth surface 13a has not been formed on the microbump 13.

Next, a smooth surface formation process (step S2), in which the smooth surface 13a is formed on the microbump 13, is carried out. In addition, the smooth surface formation process S2 corresponds to a void removal process, in which a void 22 is removed from an inside of the microbump 13.

A detail of the smooth surface formation process (void removal process) S2 will now be described with reference to FIG. 6.

Figure 6:
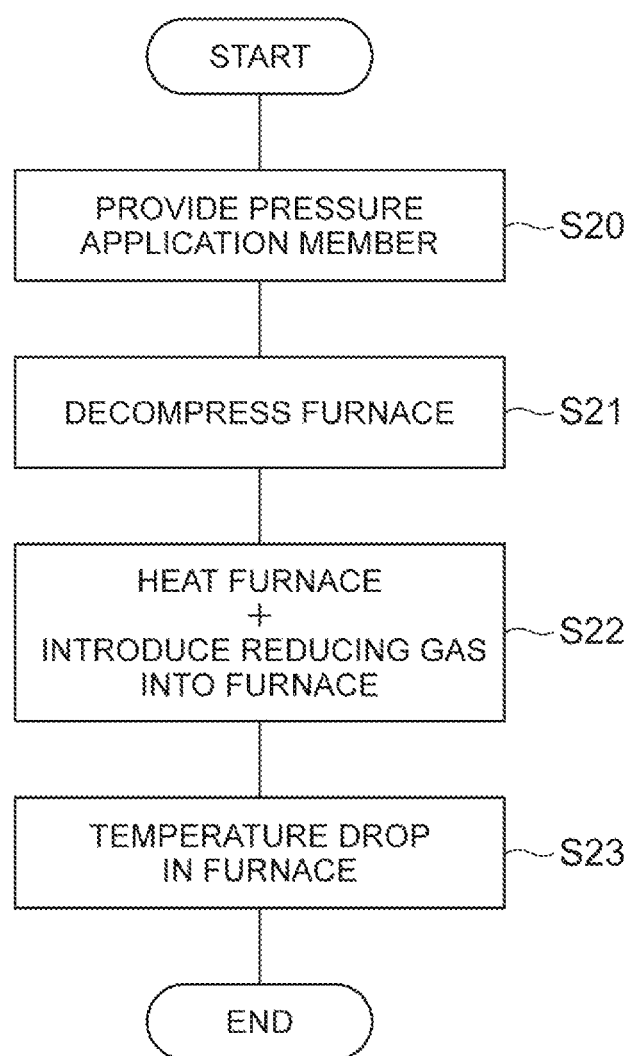
FIG. 6 is a flow chart that presents a procedure of the smooth surface formation process (void removal process)
Figure 9:
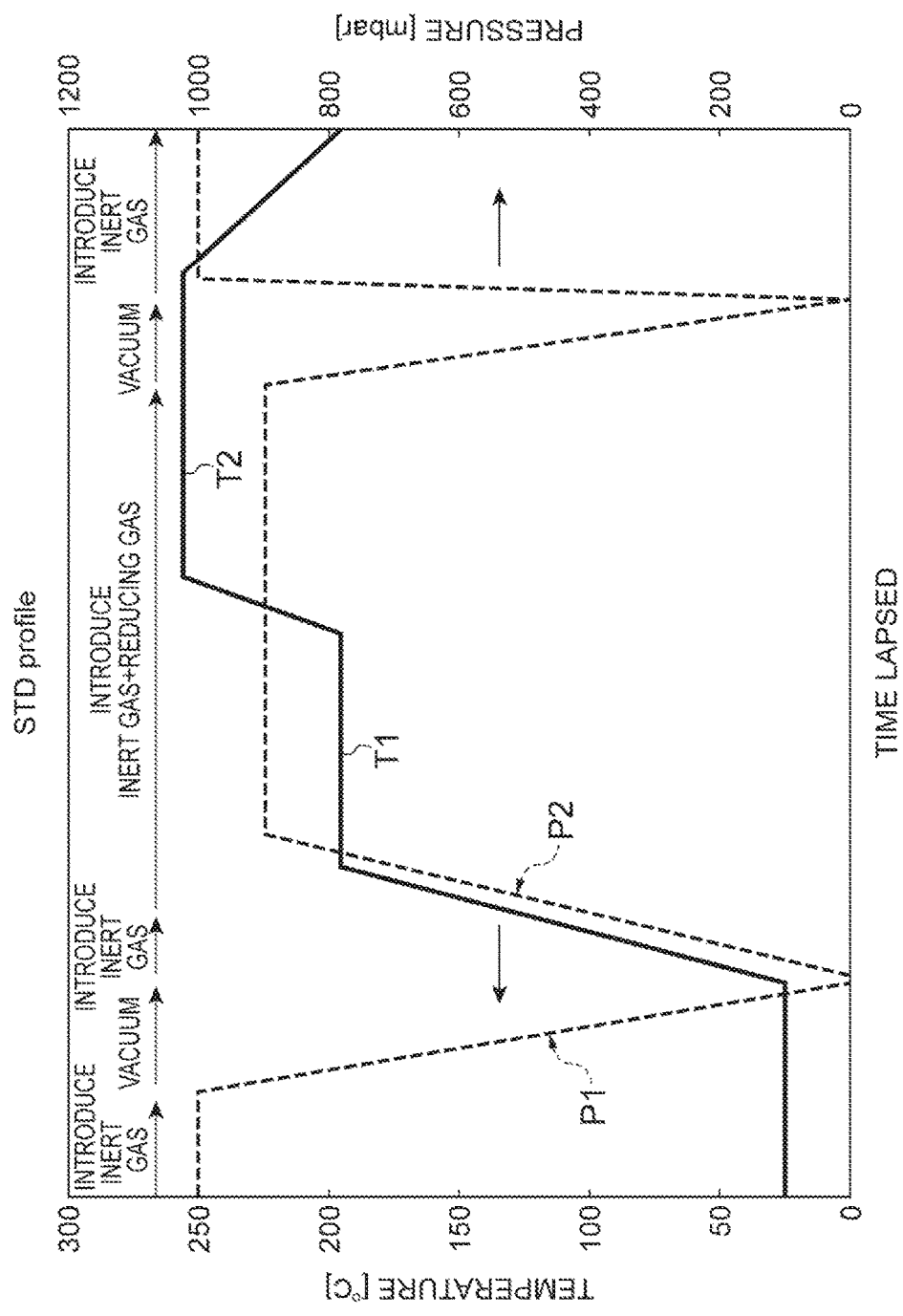
FIG. 9 is a graph that presents a profile of the temperature and pressure in the heating furnace.

As presented in FIGS. 6 and 7A, a pressure application member placement process (step S20), in which a pressure application member 21 is placed on the microbump 13, is carried out. In this manner, the semiconductor chip 1 is arranged inside of a heating furnace in a state where the pressure application member 21 is placed thereon. It should be noted that the subsequent description will be given with reference to a profile of a temperature and pressure in the heating furnace presented in FIG. 9 as appropriate. It should be noted that in FIG. 9, the solid line denotes the temperature in the heating furnace and the dashed line denotes the pressure in the heating furnace.

As materials that compose the pressure application member 21 mounted on the microbump 13, it is preferable that materials that do not react with the microbump 13 are adopted. For instance, Si, $SiO_2$, SiN, and the like are adopted as materials that compose the pressure application member 21. In addition, among the principal surfaces of the pressure application member 21, a principal surface 21a that contacts the microbump 13 is preferably constructed as a flat surface. It is because the pressure application member 21 becomes hard to remove because, for example, if a protrusion or the like is formed on the principal surface 21a, it is caught with the microbump 13. It is preferable that the only pressure that the pressure application member 21 applies to the microbump 13 is the own weight of the pressure application member 21 itself. More specifically, it is preferable that the pressure is from 0.0005 $μg/μm^2$ to 0.1 $μg/μm^2$ per cross-sectional area of the microbump. For instance, if the pressure or the height of the pressure application member 21 is controlled with a method such as flip-chip implementation, the pressure applied to the pressure application member 21 is reduced when the microbump 13 changes from a solid to a liquid (when it changes from FIGS. 7B to 7C), and hence a misalignment occurs in the position of the pressure application member 21. With respect to a small bump such as the microbump 13, a slight misalignment causes excessive pressure to be applied.

Next, a decompression process (step S21), in which a space in the heating furnace where the semiconductor chips 1 are arranged is decompressed, is carried out. In the decompression process S21, inside of the heating furnace is vacuumed so that a reduced-pressure atmosphere is created. Oxygen remaining in the heating furnace causes the microbump 13 to be oxidized. Accordingly, it is preferable that inside of the heating furnace is decompressed to a decompressed state of atmospheric pressure (from $1.01 \times 10^5$ Pa to $1 \times 10^3$ Pa or less, in particular, 5 Pa or less). This reduces the pressure in the heating furnace (see P1 portion of the graph of FIG. 9). Inert gas is introduced in the heating furnace of the reduced-pressure atmosphere. This raises the pressure in the heating furnace (see P2 portion of the graph of FIG. 9). When the temperature inside the heating furnace is raised to a temperature range of melting temperature or higher (melting point or higher) of the microbump 13, inert gas prevents further oxidization of the surface of the microbump 13 and realizes melting of the microbump 13, thus functioning as a heating medium in the heating furnace. As such inert gas, for example, nitrogen ($N_2$) gas, argon (Ar) gas, and the like can be used.

Next, a heating process (step S22), in which reducing gas is caused to flow in the heating furnace in an inert atmosphere and heated at a temperature of melting point or higher of microbump 13, is carried out. The heating process S22 is carried out after the inert gas is introduced into the heating furnace or substantially simultaneously with introduction of the inert gas. In the heating process S22, the temperature inside the heating furnace is raised at a predetermined rate of temperature rise (for instance 35 to 45° C./minute), and the temperature inside the heating furnace in a state where the inert gas has been introduced is raised to the temperature range of melting point or higher of the microbump 13. For example, when the bump is composed of Sn—Ag—Cu alloy, the melting point is approximately 220 to 230° C. although depending upon the composition of the alloy, and hence the temperature inside the heating furnace is raised to the temperature range of such temperature or higher.

It is preferable that the introduction of reducing gas is carried out before or after at the temperature at which a reduction reaction of an oxide film 23 begins. While maintaining the temperature inside the heating furnace (temperature T1 of FIG. 9) at the temperature at which a reduction reaction begins or higher, reducing gas with an appropriate density and flow rate is continued to be supplied. This allows the oxide film 23 existing on the surface of the microbump 13 to be reduced and removed. As a reducing gas, for example, carboxylic acid (formic acid) is applied. Examples of carboxylic acid include lower carboxylic acid such as formic acid, acetic acid, acrylic acid, and propionic acid. If formic acid is used as a reducing gas, it is preferable that formic acid is introduced when the temperature inside the heating furnace becomes about 110° C. Even if formic acid is introduced at a temperature at which a reduction reaction begins or lower, the reaction does not proceed, and if the temperature is too high, the microbump 13 is heated with the oxide film 23 on the surface being left and hence the pressure inside the void 22 rises. Removing the oxide film 23 in a state where the pressure inside the void 22 has excessively risen releases the pressure inside the void 22 all at once and the microbump 13 that has been liquefied may scatter. Accordingly, the temperature T1 at which the reducing reaction begins may be maintained for a predetermined length of time, and in a stage where the oxide film 23 has been sufficiently removed, the temperature of the heating furnace may be maintained at the temperature T2, which is the melting point or higher of the microbump 13 (see FIG. 9).

When the microbump 13 has been molten, the void 22 has been removed, and the smooth surface 13a has been formed, a temperature drop process (step S23), in which the temperature of the heating furnace is dropped, is carried out.

More specifically, in the heating furnace where the temperature T2, which is the melting point or higher of the microbump 13, is maintained, after the microbump 13 is exposed to formic acid for a predetermined length of time (for instance, 0.5 to 3 minutes), the formic acid introduced into the heating furnace is exhausted by vacuuming. After the formic acid introduced into the heating furnace is exhausted or substantially simultaneously with the exhaust of the formic acid, inside the heating furnace is dropped at a predetermined rate of temperature drop (for example, −5 to −40° C./minute). It should be noted that in FIG. 9, vacuuming is carried out before the temperature in the heating furnace is dropped. However, when the temperature in the heating furnace is dropped to a temperature range where molten bump is solidified to some extent, an inert gas such as nitrogen gas and argon gas may be introduced into the heating furnace to return to the atmospheric pressure.

By carrying out the heating process S22 and the temperature drop process S23 as described above, as presented in FIGS. 7B to 7G, the void 22 is removed from the microbump 13 and the smooth surface 13a is formed on the microbump 13. In other words, by carrying out heating in an atmosphere of reducing gas, the oxide film 23 formed on the surface of the microbump 13 is reduced and removed (see FIG. 7B). Then, by applying heat at or higher than a temperature of the melting point of the microbump 13, the microbump 13 is molten. Thus, the pressure of the pressure application member 21 deforms the microbump 13 as if it is collapsed. Due to this, in accordance with the shape of the principal surface 21a of the pressure application member 21, a shape corresponding to the smooth surface 13a is formed on the microbump 13 (see FIGS. 7C to 7F). In addition, the microbump 13 that has been molten is pushed by the pressure application member 21 and flows, and thus the void 22 in the microbump 13 rises and escapes to outside (see FIGS. 7C to 7F). By returning the temperature in the heating furnace, the microbump 13 is cooled and hardened. Thus, the smooth surface 13a is formed on the microbump 13 (see FIG. 7G).

Returning to FIG. 2, after the smooth surface formation process S2 has been completed with regard to each of the semiconductor chips 1, a lamination process (step S3), in which three or more of the semiconductor chips 1 are laminated by overlaying the microbump 13 of one of the semiconductor chips 1 on the microbump 13 of another one of the semiconductor chips 1, is carried out. In the present embodiment, in the lamination process S3, the smooth surface 13a is formed on the microbump 13 of one of the semiconductor chips 1 and another one of the semiconductor chips 1. Then, the microbump 13 of one of the semiconductor chips 1 contacts the microbump 13 of another one of the semiconductor chips 1 on the smooth surface 13a. In the lamination process S3, all the semiconductor chips 1 are overlaid in a state where the microbumps 13 are not bonded to each other.

Figure 3A:
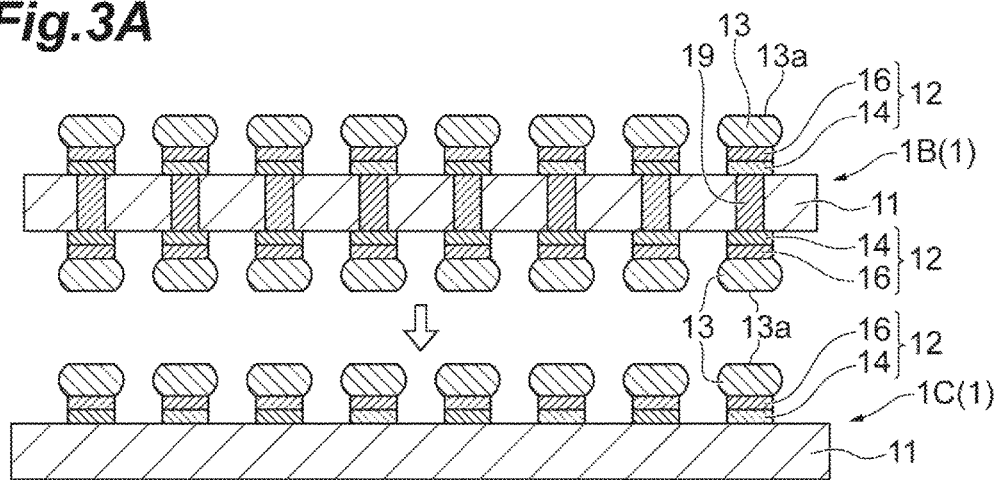
FIGS. 3A and 3B are schematic sectional views that present semiconductor chips being laminated.
Figure 3B:
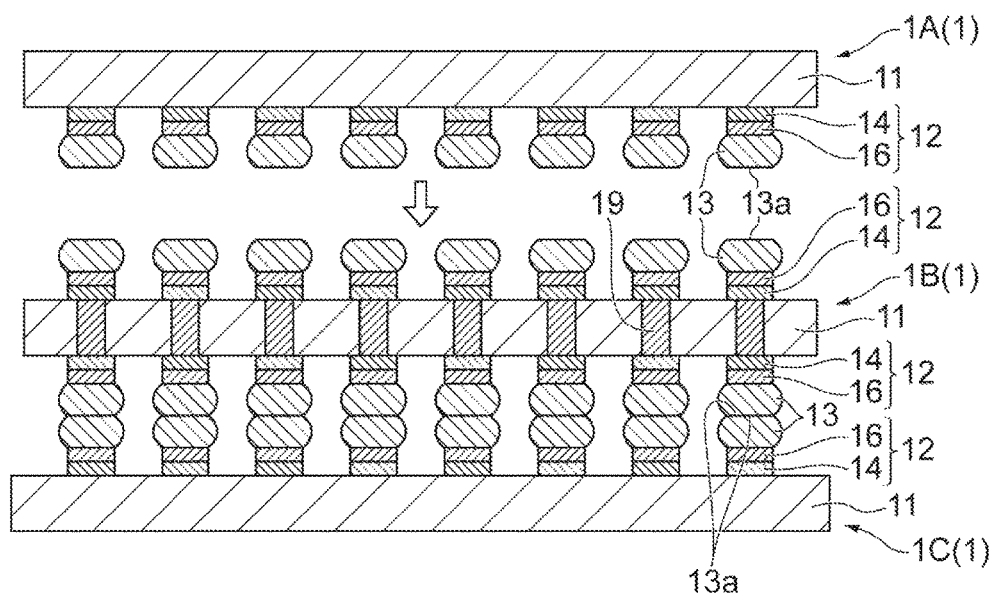

More specifically, as presented in FIGS. 3A and 3B, the microbump 13 of the semiconductor chip 1B is overlaid on the microbump 13 of the semiconductor chip 1C, which is the bottommost. At this time, the smooth surface 13a of the microbump 13 of the semiconductor chip 1B is overlaid on the smooth surface 13a of the microbump 13 of the semiconductor chip 1C. In addition, the microbump 13 of the semiconductor chip 1C and the microbump 13 of the semiconductor chip 1B are not bonded to each other, and they are in a state of simply contacting each other.

Next, as presented in FIGS. 3B and 4A, the microbump 13 of the semiconductor chip 1A, which is the uppermost, is overlaid on the microbump 13 of the semiconductor chip 1B, which is the second from the bottom. At this time, the smooth surface 13a of the microbump 13 of the semiconductor chip 1A is overlaid on the smooth surface 13a of the microbump 13 of the semiconductor chip 1B. In addition, the microbump 13 of the semiconductor chip 1B and the microbump 13 of the semiconductor chip 1A are not bonded to each other, and they are in a state of simply contacting each other.

After completing the lamination process S3, a bonding process (step S4), in which the semiconductor chips 1 are bonded to each other via the microbumps 13 by heating to melt the microbumps 13, is carried out. In the bonding process S4, all the microbumps 13 are collectively molten by heating once and all the semiconductor chips 1 are collectively bonded. In addition, in the bonding process S4, the microbumps 13 of the semiconductor chips 1 are molten in a reducing atmosphere.

More specifically, as presented in FIG. 4A, a lamination in a state where the semiconductor chip 1A, the semiconductor chip 1B, and the semiconductor chip 1C are laminated via the microbumps 13 is arranged in the heating furnace. Then, by heating the lamination in the heating furnace, all the microbumps 13 in the lamination are molten and the microbumps 13 that have been contact each other are collectively bonded. Thus, the semiconductor chip 1A, the semiconductor chip 1B, and the semiconductor chip 1C are be bonded via the bonded portion 8 at which two of the microbumps 13 are molten and bonded to each other, as presented in FIG. 4B.

After completing the bonding process S4, a semiconductor package creation process (step S5), in which the semiconductor package 100 is created, is carried out. In the semiconductor package creation process S5, the laminate 2, which is obtained in the bonding process S4, is coupled to the organic substrate 4, and the laminate 2 is covered with the molded portion 6. With above, the semiconductor package 100 is completed and the method for producing presented in FIG. 2 terminates.

Next, an operation and effect of the method for producing the semiconductor package 100 according to the present embodiment will be described.

In the method for producing the semiconductor package 100, in the heating process S22, the reducing gas is caused to flow in an inert atmosphere into a space where the semiconductor chips 1 are arranged. Thus, the oxide film 23 formed on a surface of the microbump 13 is reduced and removed. In addition, heated at a temperature of the melting point of the microbump 13 or higher, and thus the microbump 13 gets fluidity by being molten. Here, in the heating process S22, the pressure application member 21 is mounted on the microbump 13. Accordingly, as the microbump 13 is molten and gets fluidity, pressure of the pressure application member 21 causes the microbump 13 to be deformed as if it is collapsed. The deformation generates a flow in the microbump 13 and the void 22 flows in the microbump 13. Thus, the void 22 flowing in the microbump 13 to escape from the microbump 13 to outside and the void 13 is removed. With above, the void 22 in the microbump 13 can be removed with ease.

As the reducing gas, carboxylic acid may be applied. Thus, the oxide film 23 on the surface of the microbump 13 is removed successfully.

The weight of the pressure application member 21 may be from 0.0005 μg/μm² to 0.1 μg/μm² per cross-sectional area of the microbump 13. Thus, the pressure application member 21 is capable of applying an appropriate pressure to remove the void 22 on the microbump 13.

In the method for producing the semiconductor package 100, in the lamination process S3, of one of the semiconductor chips 1 and another one of the semiconductor chips 1, the smooth surface 13a is formed on the microbump 13 of at least one of them, and the microbump 13 of one of them contacts the microbump 13 of the other one of them on the smooth surface 13a. In this manner, by overlaying the microbumps 13 of each other using the smooth surface 13a, one of the semiconductor chips 1 and the other one of the semiconductor chips 1 can be laminated with accurate positioning. This allows even a multitude of semiconductor chips 1 of three or more to be laminated in a state with accurate positioning between the semiconductor chips 1. By carrying out the bonding process S4 in this state, the semiconductor chip 1 and the semiconductor chip 1 can be bonded with accurate positioning.

In the lamination process S3, all the semiconductor chips 1 are overlaid in a state where the microbumps 13 are not bonded to each other, and in the bonding process S4, all the microbumps 13 are collectively molten by heating once and all the semiconductor chips 1 are collectively bonded. This can prevent the bonded portion 8, which has been bonded by melting the microbump 13 once, from being repeatedly heated. Accordingly, reduction of the strength of the bonded portion 8 can be prevented.

Both the microbump 13 of one of the semiconductor chips 1 and the microbump 13 of another one of the semiconductor chips 1 contain Sn, and in the bonding process S4, the microbump 13 of one of the semiconductor chips 1 and the microbump 13 of another one of the semiconductor chips 1 may be molten in a reducing atmosphere. Thus, the oxide film 23 formed on the surface of the microbumps 13 of each other is reduced and removed. In addition, since the microbumps 13 of each other contain Sn, they are mixed with each other and integrated with melting. With this, by an action of surface tension of the microbump 13 that has been liquefied, a position misalignment between one of the semiconductor chips 1 and the other one of the semiconductor chips 1 (self-alignment effect).

The smooth surface formation process S2 includes the heating process S22, in which a reducing gas is caused to flow in an inert atmosphere with respect to the space where the semiconductor chips 1 are arranged and heated at a temperature of melting point or higher of the microbump 13 so that the oxide film 23 on the surface of the microbump 13 is removed, and in the heating process S22, the pressure application member 21 may be mounted on the microbump 13. In the heating process S22, a reducing gas is caused to flow in an inert atmosphere with respect to the space where the semiconductor chips 1 are arranged and heated at a temperature of melting point or higher of the microbump 13 so that the oxide film 23 on the surface of the microbump 13 is removed. Thus, the oxide film 23 formed on the surface of the microbump 13 is reduced and removed, and the microbump 13 gets fluidity by being molten. Here, in the heating process S22, the pressure application member 21 is mounted on the microbump 13. Accordingly, as the microbump 13 is molten and gets fluidity, pressure of the pressure application member 21 causes the microbump 13 to be deformed as if it is collapsed. The deformation generates a flow in the microbump 13 and the void 22 flows in the microbump 13. Thus, the void 22 flowing in the microbump 13 escapes from the microbump 13 to outside and the void 22 is removed. In addition, in the microbump 13 that has been molten, a portion pushed by the pressure application member 21 is formed as the smooth surface 13a in accordance with the shape of the pressure application member 21.

The present invention is not to be limited to the embodiment described above.

For instance, as presented in FIG. 8, a spacer 26 that has a certain thickness is arranged on the substrate 11 and the pressure application member 21 may be pushed to contact the spacer 26. This causes the spacer 26 to stop the pressure application member 21 and thus can prevent the microbump 13 from being collapsed too much. For example, before heated, the spacers 26 are arranged on the both sides of the microbump 13 and the pressure application member 21 is mounted on the microbump 13 (see FIG. 8A). In this state, heated in a reducing atmosphere and the oxide film is removed (see FIG. 8B). The, when the microbump 13 is molten, the pressure application member 21 drops and contacts the upper surface of the spacer 26 (see FIG. 8C). Thus, the pressure application member 21 is supported by the spacer 26 and does not drop any further. On the other hand, in the microbump 13 that has been molten, a flow is generated due to an impact of the pressure application member 21 and the void 22 rises and is removed (see FIGS. 8D to 8G).

In addition, in the embodiment described above, the microbump 13 of the semiconductor chip 1 of the lower side has the smooth surface 13a and the microbump 13 of the semiconductor chip 1 of the upper side has the smooth surface 13a. Accordingly, the smooth surface 13a of the microbump 13 of the upper side is mounted on the smooth surface 13a of the microbump 13 of the lower side. However, the smooth surface 13a may be formed on any one of the microbump 13 of the upper side and the microbump 13 of the lower side and the smooth surface 13a may not be formed on the other side.

It should be noted that the number of lamination of the semiconductor chips 1 may not be specified and it may be two layers.

In addition, the void 22 only has to escape from the microbump 13 using the pressure application member 21. In other words, the smooth surface 13a may not be formed on the microbump 13 depending upon the shape of the pressure application member 21.

EXAMPLES

Examples of the present invention will be described next. However, the present invention is not to be limited to the Examples described below.

Examples 1 to 7

As Example 1, a semiconductor chip that includes a microbump as follows was produced. First, a substrate was provided with Cu plating, Ni plating, and Sn plating using an electrolytic plating process. After this was arranged in a heating furnace, an atmosphere pressure in the heating furnace was adjusted and density and flow rate of nitrogen and formic acid gas to be supplied to the heating furnace were adjusted. This caused a sample of the semiconductor chip on which a plating film was molten and the microbump was formed to be created. The Cu plating layer is 17 μm high, the Ni plating layer is 3 μm high, the microbump is 15 μm high, and the microbump is 35 μm in diameter. A void was observed in the microbump when the sample was observed by transmission X-ray. This sample and a pressure application member were prepared. The pressure application member was an Si wafer that includes an $SiO_2$ film. The Si wafer was mounted on the microbump so that the $SiO_2$ surface contacted the bump. The weight of the pressure application member was 0.0005 μg/μm² per cross-sectional area of the microbump. It should be noted that the spacer as presented in FIG. 8 was not provided. After the semiconductor chip in a state where the pressure application member was mounted thereon was arranged in the heating furnace, inside of the heating furnace was vacuumed to 5 Pa or less. A subsequent atmosphere pressure in the heating furnace was adjusted and density and flow rate of nitrogen and formic acid gas to be supplied to the heating furnace were adjusted. More specifically, heat was applied with conditions of a rate of temperature rise of 45° C./min, preheat of 195° C. (6 minutes), and the maximum of 260° C. (1 minute). The microbump was provided with pressure by the pressure application member and a smooth surface was formed. In this manner, the microbump according to Example 1 was obtained.

The microbump that was formed using the pressure application member of 0.002 μg/μm² per cross-sectional area of the microbump was Example 2. The microbump that was formed using the pressure application member of 0.003 μg/μm² per cross-sectional area of the microbump was Example 3. The microbump that was formed using the pressure application member of 0.01 μg/μm² per cross-sectional area of the microbump was Example 4. The microbump that was formed using the pressure application member of 0.03 μg/μm² per cross-sectional area of the microbump was Example 5. The microbump that was formed using the pressure application member of 0.06 μg/μm² per cross-sectional area of the microbump was Example 6. All of the other conditions of Examples 2 to 6 were the same as those of Example 1. In addition, the microbump that was formed by inserting a 30-μm spacer made of SUS316 between the pressure application member and the substrate was Example 7. In Example 7, the pressure application member of 0.03 μg/μm² per cross-sectional area of the microbump was used. All of the other conditions of Example 7 were the same as those of Example 1.

Comparative Examples 1 to 7

The microbumps according to Comparative Examples 1 to 7 were formed by applying heat in the atmosphere. In Comparative Example 1, the pressure application member of 0.001 μg/μm² per cross-sectional area of the microbump was used. In Comparative Example 2, the pressure application member of 0.002 μg/μm² per cross-sectional area of the microbump was used. In Comparative Example 3, the pressure application member of 0.003 μg/μm² per cross-sectional area of the microbump was used. In Comparative Example 4, the pressure application member of 0.010 μg/μm² per cross-sectional area of the microbump was used. In Comparative Example 5, the pressure application member of 0.03 μg/μm² per cross-sectional area of the microbump was used. In Comparative Example 6, the pressure application member of 0.06 μg/μm² per cross-sectional area of the microbump was used. In Comparative Example 7, the pressure application member of 0.10 μg/μm² per cross-sectional area of the microbump was used. All of the other conditions of Comparative Examples 1 to 7 were the same as those of Example 1.

(Evaluations)

The height of the microbumps of Examples and Comparative Examples was presented in "Microbump Height (μm)" of FIG. 10. Among Examples and Comparative Examples, those with a void that was reduced after reflow are provided with "○" and those with a void that was not reduced are provided with "x" in "Void" of FIG. 10. Among Examples and Comparative Examples, those with the microbump that did not fall over after the pressure application member was removed from the microbump after reflow are provided with "○" and those with the microbump that fell over are provided with "x" in "Electrode Falling Over" of FIG. 10.

As presented in FIG. 10, in Examples 1 to 6, an effect of void reduction was seen and no microbumps fell over. However, in Example 6, "Δ" was provided because molten Sn flew into the electrode pad. In Example 7, providing the spacer makes the height of the bump equal to the thickness of the spacer, thereby having an effect of prevention of being excessively pushed. Accordingly, in comparison with Example 6, Example 7 indicates that the molten Sn was prevented from flowing to the electrode pad. On the other hand, Comparative Examples 1 to 6 indicate that the void reduction had no effect. This is presumably because the oxide film formed on the surface of the microbump has an effect of making the microbump hard to deform and the oxide film with hard surface blocks the fluidity of inside. In addition, Comparative Example 7 indicates that the microbump fell over because of the excessive weight of the pressure application member.

1 . . . semiconductor chip, 2 . . . lamination, 11 . . . substrate, 12 . . . conductive portion, 13 . . . microbump, 13a . . . smooth surface, 21 . . . pressure application member, 22 . . . void, 23 . . . oxide film, 26 . . . spacer

What is claimed is:

1. A method for producing a semiconductor package having a plurality of laminated semiconductor chips, each of the semiconductor chips including substrate, a conductive portion formed on the substrate, and a microbump formed on the conductive portion, the method comprising:
    heating to cause a reducing gas to flow in an inert atmosphere into a space where the semiconductor chips are arranged, in which heating is at or higher than a temperature of a melting point of the microbump, wherein
    a pressure application member is mounted on the microbump and a principal surface of the pressure application member directly contacts with the microbump during heating, and
    the pressure application member is removed from the microbump after heating.

2. The method for producing a semiconductor package according to claim 1, wherein the reducing gas comprises carboxylic acid.

3. The method for producing a semiconductor package according to claim 1, wherein a weight of the pressure application member per cross-sectional area of the microbump is from 0.0005 μg/μm² to 0.1 μg/μm².

4. The method for producing a semiconductor package according to claim 1, wherein a spacer that has a certain thickness is arranged on the substrate and the pressure application member contacts the spacer during heating.

5. The method for producing a semiconductor package according to claim 4, wherein the spacer is located next to the microbump and the microbump is deformed toward a partially collapsed configuration until the pressure application member contacts the spacer.

6. The method for producing a semiconductor package according to claim 5, wherein a surface of the microbump in the collapsed configuration is level with a top of the spacer.

7. The method for producing a semiconductor package according to claim 5, wherein the spacer is removed from the substrate after the pressure application member has been removed from a surface of the microbump.

8. The method for producing a semiconductor package according to claim 1 further comprising:
    laminating two or more of the semiconductor chips by overlaying a first microbump of one of the semiconductor chips on a second microbump of another one of the semiconductor chips after removing the pressure application member; and
    bonding the semiconductor chips to each other via the first and second microbumps by heating to melt the first and second microbumps.

9. The method for producing a semiconductor package according to claim 1, wherein the principal surface comprises a flat surface.

10. The method for producing a semiconductor package according to claim 1, wherein an amount of pressure applied on a surface of the microbump corresponds to a weight of the pressure application member.

11. The method for producing a semiconductor package according to claim 1, wherein heating is performed prior to overlaying the microbump of one of semiconductor chips on the microbump of another one of the semiconductor chips.

12. A method comprising:
    exposing a partially assembled semiconductor chip to a reducing gas in an inert atmosphere, wherein the semiconductor chip includes a substrate and a microbump located on the substrate;
    heating the semiconductor chip to achieve a melting point temperature of the microbump;
    placing a pressure application member on a surface of the microbump and a spacer located next to the microbump to deform the microbump toward a partially collapsed configuration; and
    removing the pressure application member from the surface of the microbump after heating.

13. The method according to claim 12, wherein an oxide film is located on the surface of the microbump, the method further comprising prior to achieving the melting point temperature of the microbump, maintaining the reducing gas for a period of time within a temperature range that is less than the melting point temperature of the microbump, wherein the reducing gas reduces at least part of the oxide film during the period of time.

14. The method according to claim 12, wherein the reducing gas comprises carboxylic acid.

15. The method according to claim 12, wherein a weight of the pressure application member per cross-sectional area of the microbump is from 0.0005 μg/μm² to 0.1 μg/μm².

16. The method according to claim 12, wherein an amount of pressure applied on a surface of the microbump corresponds to a weight of the pressure application member.

17. The method according to claim 12, wherein the microbump deforms toward the partially collapsed configuration until the pressure application member contacts the spacer located next to the microbump.

18. The method according to claim 17, wherein the surface of the microbump in the collapsed configuration is level with a top of the spacer.

19. The method according to claim 12, further comprising removing the spacer from the substrate after the pressure application member has been removed from the surface of the microbump.

* * * * *